United States Patent
Schuelke et al.

(10) Patent No.: US 12,224,165 B2
(45) Date of Patent: Feb. 11, 2025

(54) MAGNETIC-FIELD-ASSISTED PLASMA COATING SYSTEM

(71) Applicants: Board of Trustees of Michigan State University, East Lansing, MI (US); Franhofer USA, East Lansing, MI (US)

(72) Inventors: Thomas Schuelke, Pinckney, MI (US); Michael Becker, East Lansing, MI (US); Lars Haubold, East Lansing, MI (US); Qi Hua Fan, Okemos, MI (US)

(73) Assignees: Board of Trustees of Michigan State University, East Lansing, MI (US); Fraunhofer USA, East Lansing, MI (US)

( * ) Notice: Subject to any disclaimer, the term of this patent is extended or adjusted under 35 U.S.C. 154(b) by 48 days.

(21) Appl. No.: 18/113,703

(22) Filed: Feb. 24, 2023

(65) Prior Publication Data

US 2023/0203641 A1 Jun. 29, 2023

Related U.S. Application Data

(62) Division of application No. 16/620,341, filed on Dec. 6, 2019, now abandoned.

(51) Int. Cl.
*C23C 14/06* (2006.01)
*C23C 14/04* (2006.01)
(Continued)

(52) U.S. Cl.
CPC ........ *H01J 37/3405* (2013.01); *C23C 14/046* (2013.01); *C23C 14/0605* (2013.01);
(Continued)

(58) Field of Classification Search
CPC . C23C 14/046; C23C 14/0605; C23C 14/325; C23C 14/35; C23C 14/0611; H01J 37/3405
See application file for complete search history.

(56) References Cited

U.S. PATENT DOCUMENTS 4,167,370 A 9/1979 Graneau et al.
4,179,351 A 12/1979 Hawton, Jr. et al.
(Continued)

FOREIGN PATENT DOCUMENTS

WO WO-2018/175689 A1 9/2018

OTHER PUBLICATIONS

Karpov, D., "Arc Source Designs," Efremov Scientific Research Institute of Electrophysical Apparatus, Jan. 1995, pp. 396-423.
(Continued)

*Primary Examiner* — Michael P Wieczorek
(74) *Attorney, Agent, or Firm* — Harness, Dickey & Pierce, PLC (57) ABSTRACT

A magnetic-field-assisted plasma coating system and method are provided. In another aspect, a coating system employs a cathode with a linearly moveable magnetic field. A further aspect employs a workpiece as an anode within which is located an elongated cathode which internally coats a bore of the workpiece. Still another aspect of the present system and method employs an elongated and hollow cathode with at least one magnetic source therein. In yet another aspect, end caps or plates seal against one or more open ends of a workpiece bore to be coated, with a cathode inserted into the bore and a vacuum being created within the bore such that the workpiece itself defines at least a portion of a vacuum chamber.

30 Claims, 6 Drawing Sheets

(51) Int. Cl.
*C23C 14/32* (2006.01)
*C23C 14/35* (2006.01)
*F02F 1/00* (2006.01)
*H01J 37/34* (2006.01)

(52) U.S. Cl.
CPC ............ *C23C 14/325* (2013.01); *C23C 14/35* (2013.01); *F02F 1/00* (2013.01); *F02F 2200/00* (2013.01)

(56) References Cited

U.S. PATENT DOCUMENTS

| | | | |
|---|---|---|---|
| 4,234,622 | A | 11/1980 | DuBuske et al. |
| 4,407,713 | A | 10/1983 | Zega |
| 4,892,633 | A | 1/1990 | Welty |
| 5,026,466 | A * | 6/1991 | Wesemeyer .......... C23C 14/046 |
| | | | 118/723 VE |
| 5,380,420 | A | 1/1995 | Tsuji |
| 5,415,754 | A | 5/1995 | Manley |
| 5,731,046 | A | 3/1998 | Mistry et al. |
| 5,855,547 | A | 1/1999 | Chaney |
| 5,972,185 | A | 10/1999 | Hendricks et al. |
| 5,988,103 | A | 11/1999 | Fetherston et al. |
| 6,159,558 | A * | 12/2000 | Wolfe ................. C23C 14/5826 |
| | | | 427/523 |
| 6,740,212 | B2 | 5/2004 | Fan et al. |
| 7,867,366 | B1 * | 1/2011 | McFarland ....... H01J 37/32614 |
| | | | 204/298.41 |
| 7,879,203 | B2 | 2/2011 | Weaver et al. |
| 8,316,797 | B2 | 11/2012 | Asmussen et al. |
| 8,387,561 | B2 | 3/2013 | Weaver et al. |
| 8,668,962 | B2 | 3/2014 | Asmussen et al. |
| 8,911,868 | B2 | 12/2014 | Scheibe et al. |
| 9,139,909 | B2 | 9/2015 | Asmussen et al. |
| 9,754,733 | B2 | 9/2017 | Fan et al. |
| 2004/0168637 | A1 | 9/2004 | Gorokhovsky |
| 2004/0180252 | A1 | 9/2004 | Wortman et al. |
| 2006/0103319 | A1 | 5/2006 | Luten et al. |
| 2007/0034501 | A1 | 2/2007 | Bender |
| 2008/0149026 | A1 | 6/2008 | Cedoz et al. |
| 2011/0073471 | A1 | 3/2011 | Weaver et al. |
| 2011/0140367 | A1 | 6/2011 | Shi |
| 2011/0162751 | A1 * | 7/2011 | Fitzgerald ................ C23C 30/00 |
| | | | 977/734 |
| 2011/0277823 | A1 | 11/2011 | Fan et al. |
| 2012/0045592 | A1 | 2/2012 | Kumar et al. |
| 2013/0000550 | A1 | 1/2013 | Brown et al. |
| 2013/0146443 | A1 * | 6/2013 | Papa ..................... C04B 41/009 |
| | | | 204/192.16 |
| 2013/0209767 | A1 | 8/2013 | Kolev et al. |
| 2013/0306495 | A1 | 11/2013 | Smith, Jr. |
| 2013/0316156 | A1 | 11/2013 | Kennedy et al. |
| 2014/0260955 | A1 | 9/2014 | Aharonov |
| 2014/0284207 | A1 * | 9/2014 | Anders ................. C23C 14/564 |
| | | | 204/192.12 |
| 2014/0313574 | A1 | 10/2014 | Bills et al. |
| 2015/0203777 | A1 | 7/2015 | Ramm et al. |
| 2015/0307360 | A1 | 10/2015 | Bills et al. |
| 2015/0369426 | A1 | 12/2015 | Smith, Jr. |
| 2016/0027608 | A1 | 1/2016 | Madocks |
| 2016/0076141 | A1 | 3/2016 | Hirota |
| 2016/0245224 | A1 | 8/2016 | Ruona et al. |
| 2017/0051393 | A1 * | 2/2017 | Han .................... H01J 37/3423 |
| 2017/0166753 | A1 | 6/2017 | Slagter et al. |
| 2018/0130687 | A1 * | 5/2018 | Bonecutter ....... H01L 21/67775 |
| 2019/0366298 | A1 | 12/2019 | Fan et al. |

OTHER PUBLICATIONS

Schuelke, T., Fraunhofer USA, Center for Coatings and Diamond Technologies, "DIAMOR® Superhard, Low Friction and Wear Resistant Coating," (Aug. 2015).

Fraunhofer Center for Coatings and Diamond Technologies, "Improving Powertrain Efficiency With Low-Friction Wear Resistant DIAMOR® Coatings," (May 26, 2017).

Rejowski, E., et al., SAE International 2012-01-1329, "Application of DLC Coating in Cylinder Liners for Friction Reduction," (Apr. 16, 2012).

Vetter, J., et al., "Surface Treatment Selections for Automotive Applications," Science Direct, Surface and Coatings Technology, vol. 200, Issues 5-6 (Nov. 21, 2005) pp. 1962-1968.

Haubold, L., et al., "The influence of the surface texture of hydrogen-free tetrahedral amorphous carbon films on their wear performance," Diamond and Related Materials, vol. 19, Issues 2-3 (Feb.-Mar. 2010) pp. 225-228.

Search Report and Written Opinion dated Aug. 23, 2018 in counterpart PCT/US2018/036474.

"Carbon Films—Basic Knowledge, Film Types and Properties," VDI 2840 (Nov. 2005) pp. 1-44.

Anders, A., "A Review Comparing Cathodic Arcs and High Power Impulse Magnetron Sputtering (HiPIMS)," Surface & Coating Technology, 257 (2014) pp. 308-325.

Kunrath, A., "PVD Coating Basics: What Cathodic Arc Deposition and Magnetron Sputtering Have in Common," Vapor Technologies, Inc. webpages (2021) six pages.

Lauzon, W., PVD Coatings vs. CVD: Two Common Coating Application Methods, Harvey Performance Company, LLC webpages (Sep. 20, 2021) eight pages.

Green, J., "Table Comparison: Physical Vapor Deposition Vs. Chemical Vapor Deposition," Stanford Advanced Materials (2021) eight pages.

Madhu, "Difference Between PVD and CVD," internet publication (Sep. 24, 2011).

* cited by examiner

MAGNETIC-FIELD-ASSISTED PLASMA COATING SYSTEM

CROSS-REFERENCE TO RELATED APPLICATIONS

This application is a divisional of U.S. patent application Ser. No. 16/620,341, filed Dec. 6, 2019, which is a national phase entry of PCT Patent Application No. PCT/US2018/036474, filed Jun. 7, 2018, which claims priority to U.S. Provisional Patent Application No. 62/516,797, filed Jun. 8, 2017, all of which are incorporated by reference herein.

BACKGROUND

The present disclosure generally pertains to coating systems and more particularly to a magnetic-field-assisted plasma coating system.

Increasing fuel efficiency is a great challenge in the automotive industry. Effective approaches to meeting the fuel efficiency requirements are to reduce the weight of vehicles and to increase the engine performance. In passenger vehicles, approximately 15% of fuel energy is spent to overcome engine friction. Therefore, optimizing the performance of engines is desirable to improving fuel efficiencies.

The vehicle manufacturers have recently been converting the heavy mass of engine blocks from cast iron to aluminum which delivers a 40% to 50% reduction of engine weight. However, aluminum is a "soft" metal and does not withstand the constant friction of pistons and piston rings scraping up and down the bore surface. Two ways have been adopted by the automotive manufacturers to protect aluminum engine cylinder bores: install iron liners or place a wear-resistant layer on the bore surface. But each conventional approach has its limitations.

Most U.S. automotive manufacturers use iron liners where each wall is approximately 3 mm thick. The room that liners require cannot always be taken from the space between each cylinder because there must be sufficient material between the cylinder bores to maintain the structural strength of the engine block. As a result, the overall engine size and weight increase which is often unacceptable. Most importantly, the friction and wear between the liner surface and the piston rings are significant and subsequently limit the fuel efficiency as well as horsepower and torque. On the other hand, many Japanese and European engines cannot afford the weight penalty imposed by the liners due to the high cost of fuel in those regions. In this case, the cylinder bore surfaces are made more wear-resistant by using hard coatings or chemical surface treatments. Unfortunately, the existing coatings and surface treatments are either expensive or cannot provide satisfactory wear resistance with low friction coefficients.

Therefore, a strong need continues to exist for further increasing wear-resistance of cylinder bores and liners while further reducing the friction between these parts and the piston rings to promote fuel efficiency and performance. Two technologies have recently been investigated, but with limited success. (1) Plasma spray coatings offer a wear-resistant surface, which protects the engine bore from piston ring wear. This technology requires extensive pre- and post-bore processing to create the desired surface condition for coating adherence and smoothness. Another problem of the spray coating is the significant thermal load transferred to the engine block during coating, which leads to large thermally induced mechanical stresses that compromise the coating reliability. (2) Plasma enhanced chemical vapor deposition has been developed to coat working surfaces with hard diamond-like carbon films. Poor coating adhesion may occur with this prior process, however, due to the low energies of ions created in the plasma. Furthermore, this type of diamond-like carbon coating is synthesized by breaking down hydrocarbon precursor gases, which intrinsically contain hydrogen. Hydrogenated films tend to react with sulfur compounds in oil lubricants and form undesirable sludge layers. Furthermore, such hydrogenated carbon coatings tend to be on the softer side of the available range of diamond-like carbon materials. Also, the reactive chemical gases need proper scrubbing for safety reasons. Hence, integrating such prior chemical vapor deposition processes into an automotive manufacturing line would require large investments.

A beneficial cathodic arc deposition process capable of producing super-hard tetrahedrally bonded amorphous carbon thin films ("ta-C") is disclosed in L. Haubold, T. Schuelke, M. Becker, G. Woodrough, "The Influence of the Surface Texture of Hydrogen-Free Tetrahedral Amorphous Carbon Films on their Wear Performance," Diamond and Related Materials 19 (2-3), 225 (March 2010); and U.S. Pat. No. 8,911,868 entitled "Coating Based on Diamond-Like Carbon" which issued to Scheibe et al. on Dec. 16, 2014, and is incorporated by reference herein. As a physical vapor deposition technology, this conventional cathodic arc process relies on line-of-sight access from the external source material to the workpiece surface, which has made it difficult to use with coating inner diameter surfaces such as cylinder bores.

Finally, U.S. Pat. No. 8,387,561 entitled "Method and Apparatus for Cathodic Arc Ion Plasma Deposition" which issued to Weaver et al. on Mar. 5, 2013, is incorporated by reference herein. This patent discloses a permanent magnet inside a cathode, however, a separate anode and a separate vacuum chamber are required which disadvantageously add expense and complexity.

SUMMARY

In accordance with the present invention, a magnetic-field-assisted plasma coating system and method are provided. In another aspect, a coating system employs a cathode with a linearly moveable magnetic field. A further aspect employs a workpiece as an anode within which is located an elongated cathode which internally coats a bore of the workpiece. Still another aspect of the present system and method employs an elongated and hollow cathode with at least one magnetic source therein. In yet another aspect, end caps or plates seal against one or more open ends of a workpiece bore to be coated, with a cathode inserted into the bore and a vacuum being created within the bore such that the workpiece itself defines at least a portion of a vacuum chamber.

The present magnetic-field-assisted plasma coating system advantageously uses a magnetically enhanced cathodic arc plasma to efficiently deposit low-friction coatings, such as a super-hard tetrahedral amorphous carbon ("ta-C") coating, onto an inner bore surface of an internal combustion engine and/or a tube. Furthermore, a magnetic field advantageously moves along a cathode to guide and control plasma arcs during a coating process. The present system and method are expected to greatly reduce the friction coefficient and increase wear resistance, thereby extending engine cylinder durability and improving fuel efficiency. Moreover, the present system and method advantageously deposit ta-C coatings or films with a thickness of about 0.01-30 microns, which does not require an enlargement of the engine packaging size or weight. It is also advantageous that the cathode is stationary relative to the workpiece through the entire coating process, thereby leading to thickness consistency of the coating along the workpiece bore. Additional advantages and features of the present invention will become apparent from the following description and appended claims, taken in conjunction with the accompanying drawings.

DETAILED DESCRIPTION

Figure 1:
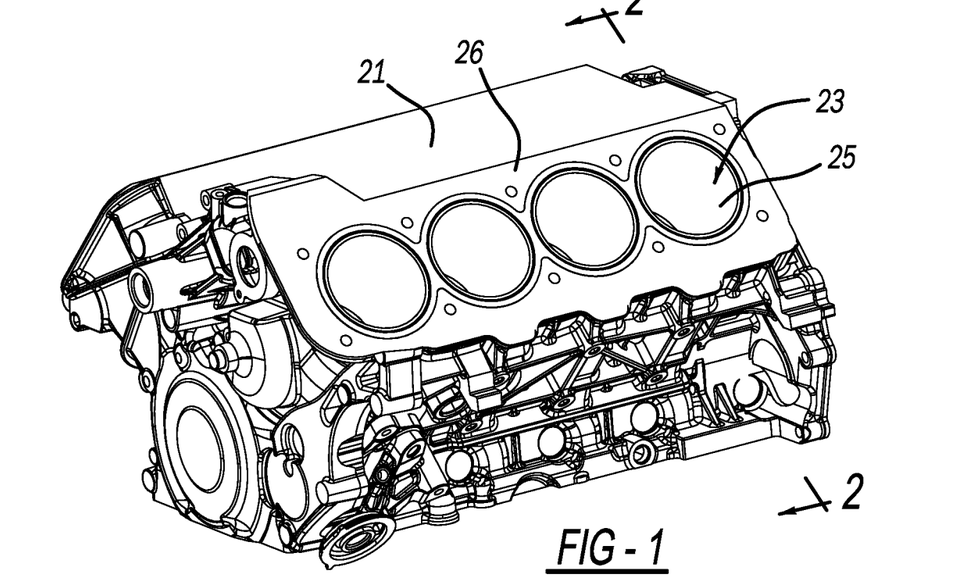
FIG. 1 is a perspective view showing an automotive vehicle engine workpiece employed with the present system and method.
Figure 2:
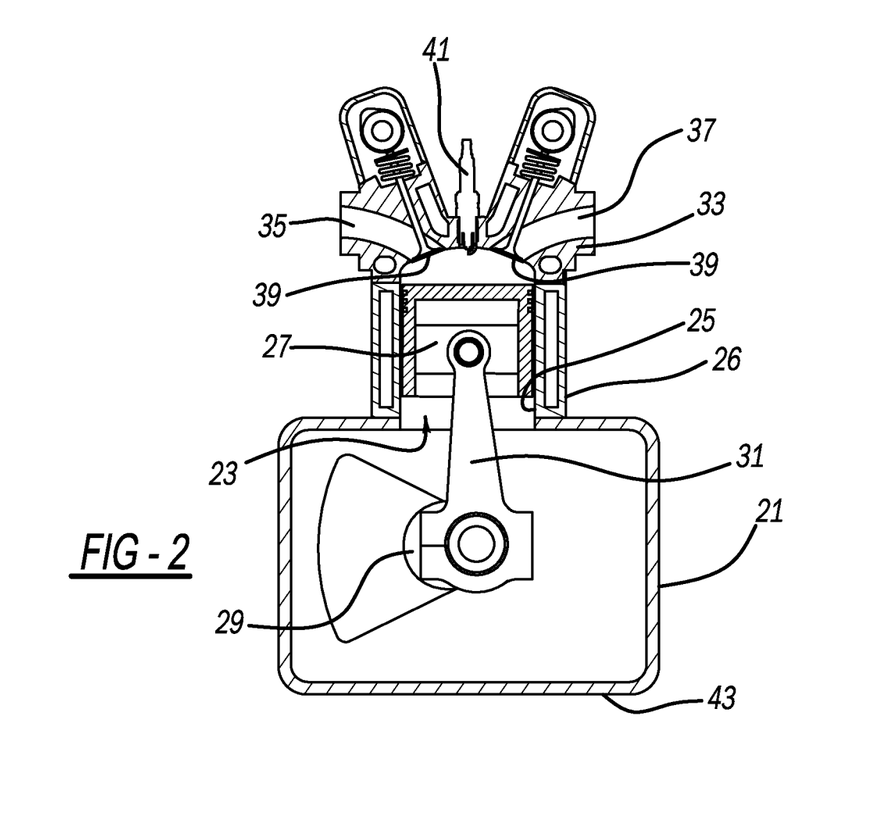
FIG. 2 is a cross-sectional view, taken along line 2-2 of FIG. 1, showing a portion of the engine employed with the present system and method.

Referring to FIGS. 1 and 2, an automotive vehicle has an internal combustion engine 21 within which are multiple bores 23 defined by cylinder surfaces 25 of an engine block workpiece 26 within which pistons 27 linearly move. Furthermore, a crank shaft 29 is rotatably connected to each piston 27 by way of a connecting rod 31. A cylinder head 33, with intake and exhaust passages 35 and 37, as well as valves 39 and a spark plug 41, are located at one end of the cylinder block 26 while a crank case 43 is located at the opposite end of the cylinder block 26.

Figure 3:
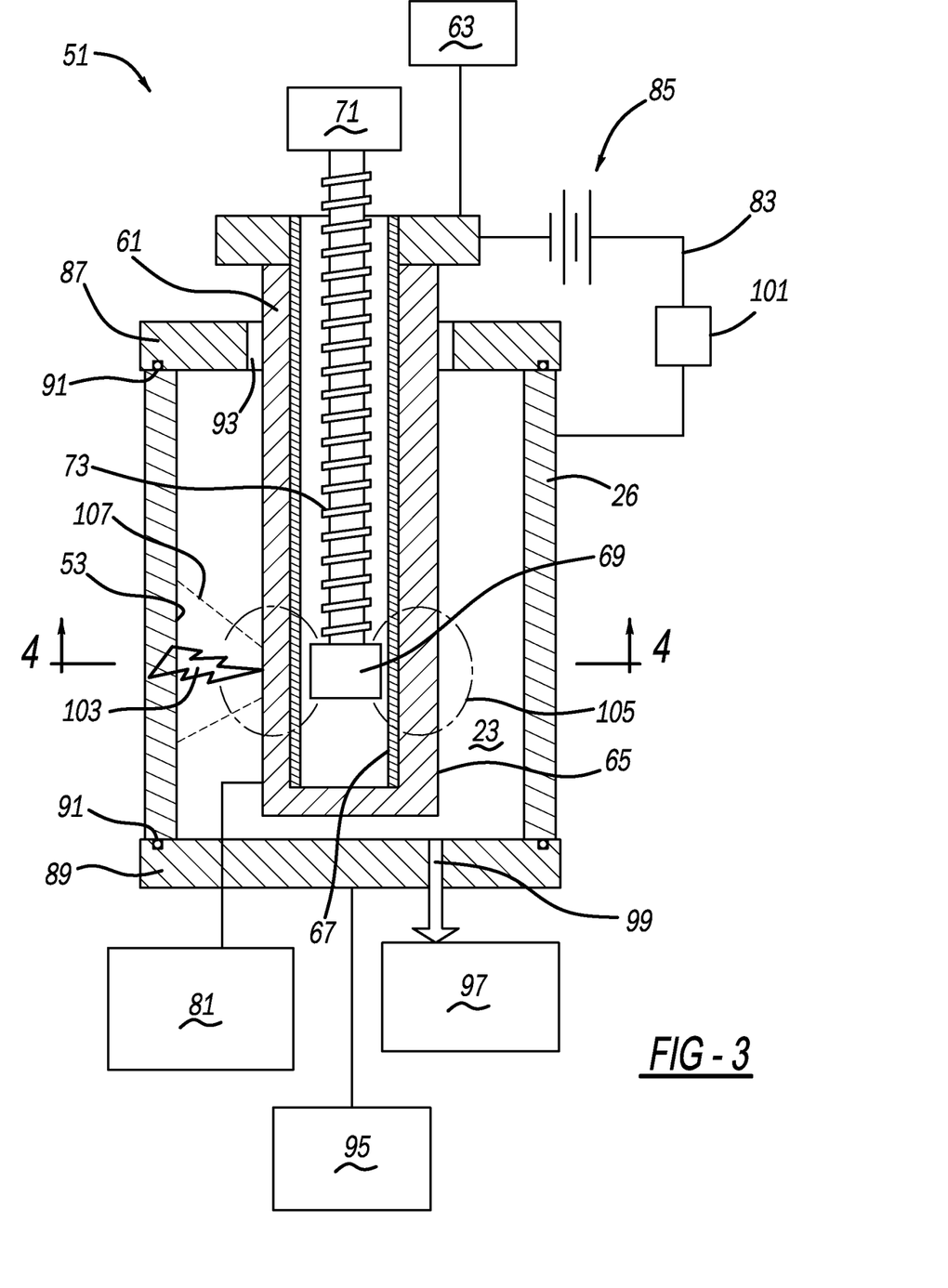
FIG. 3 is a longitudinal sectional view showing a first embodiment of the present system and method.
Figures 4, 6:
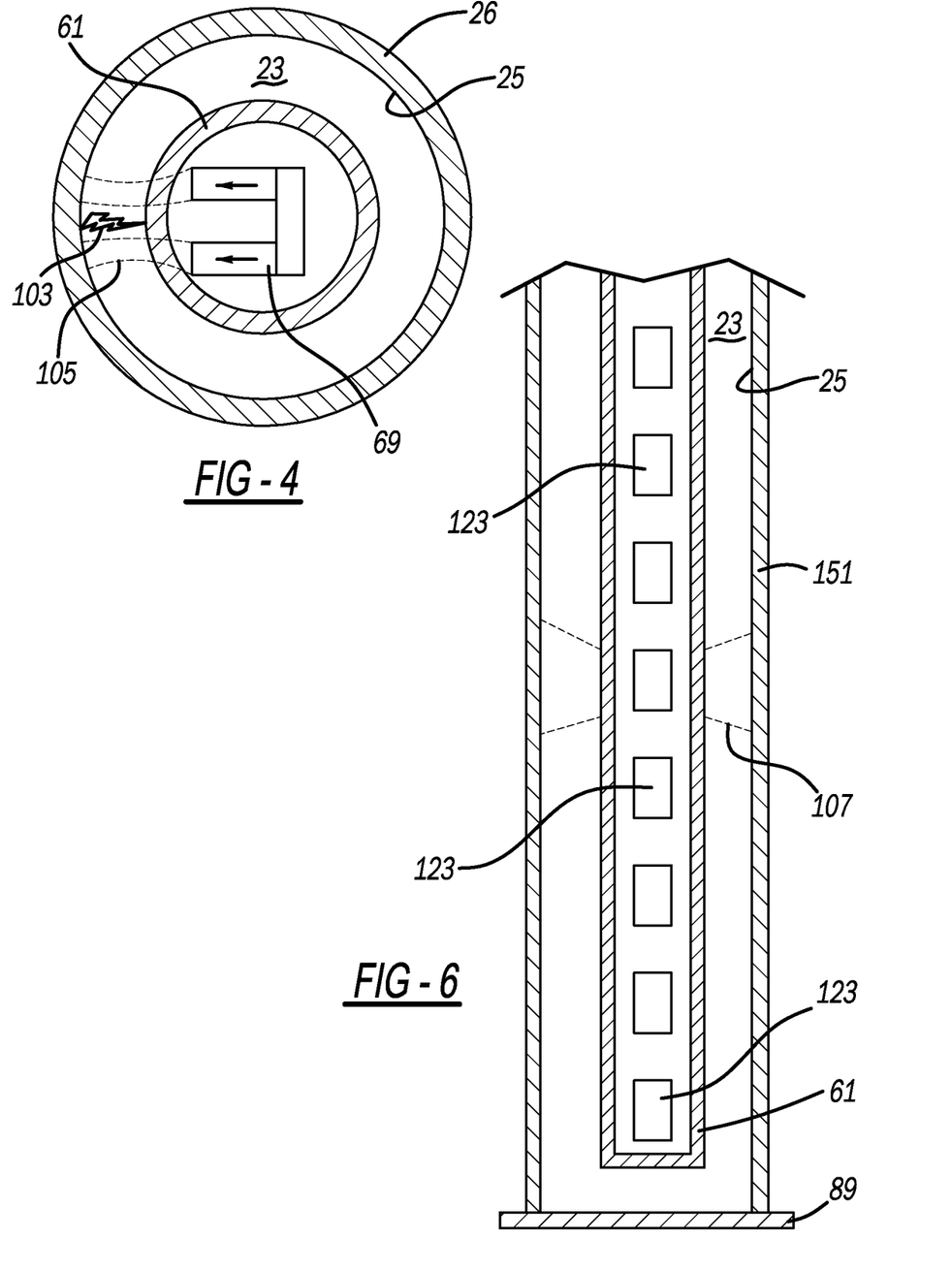
FIG. 4 is a cross-sectional view, taken along line 4-4 of FIG. 3, showing the first embodiment system and method.
FIG. 6 is a longitudinal sectional view showing a third embodiment of the present system and method.

FIGS. 3 and 4 illustrate a first embodiment of a magnetic-field-assisted plasma coating system 51. In this construction, engine block 26 is the workpiece to be coated with ta-C 53, and serves as an anode in the overall system and machine. A longitudinally elongated cathode 61 is concentrically and coaxially moveable within each bore 23 by a robotic arm 63 or other automated mechanism, from a retracted position to an advanced position (as shown in FIG. 3). Cathode 61 has a generally cylindrical outside surface 65 made from graphite. Furthermore, cathode 61 has a longitudinally elongated and hollow interior 67 within which is located a magnetic source, preferably a permanent magnet 69. The magnetic force at exterior surface 65 of cathode 61 is preferably 1-20 milliteslas.

An actuator 71 and driven transmission 73 linearly move magnet 69 in the advancing and retracting directions within cathode 61. A programmable controller 101 of an electrical circuit 83 energizes and de-energizes actuator 71. Actuator 71 may be an automatically energized electric motor or fluid-powered cylinder. Transmission 73 may be a jack screw (as shown) with an interior of magnet 69 being attached to and moveable with an internally threaded nut or ball, a cable and slide mechanism, a piston rod if a fluid driven cylinder is used, or the like.

A longitudinal length of cathode 61 is at least twice and more preferably at least five times a lateral diameter dimension of cathode 61. Moreover, an arc ignitor 81 is located adjacent cathode 61 within cylinder bore 23 for initiating a plasma arc between cathode 61 and workpiece anode 26. Electrical circuit 83 connects a direct current power source 85 with both cathode 61 and workpiece anode 26. Alternately, power source 85 may combine direct and pulsed current, especially if carbon cathodes are employed.

A pair of opposed plates or end caps 87 and 89 of the present system and machine are moveable from a retracted position to an advanced position (as shown in FIG. 3) where elastomeric or rubber o-rings, skirts or bulb seals 91 contact against ends of engine block workpiece 26 in order to provide an entirely enclosed area within each bore 23. An aperture 93 is centrally located within end cap 87 allowing entry of cathode 61 associated with each bore 23. An elastomeric or rubber bulb seal, o-ring or skirt may be employed therebetween in order to seal aperture 93 after full insertion of cathode 61. An automated mechanism 95 such as a robotic arm, actuator-driven linkage, actuator-driven ball screw or the like, controlled by controller 101, operably moves end caps 87 and 89 from their retracted positions to their sealing and advanced positions against engine block 26. Alternately, a robotic or other mechanism may move the engine block relative to one of the stationary end plates with the opposite end cap thereafter being advanced to enclose the bore. Alternately, the cathode can be removeably attached to and moveable with the end cap to make sealing easier and only requiring a single actuator to simultaneously advance both components.

A vacuum source, such as a pump 97, is thereafter actuated to create a reduced pressure or vacuum through an outlet 99 in one of the caps 89. The vacuum pressure within bore 23 is preferably at least $10^{-3}$ and more preferably also less than $10^{-6}$ Torr for a bore diameter of about 10 cm and a cathode outer diameter of about 2 cm. It is noteworthy that in one exemplary configuration, exterior surface 65 of cathode 61 is only 2-5 cm away from inner bore surface 25 of engine block workpiece 26, thereby allowing the vacuum pressure that is sufficiently low for successful vapor deposition to be created relatively quickly and also subsequently allowing for relatively fast plasma coating especially as compared to conventional attempts.

Figure 5:
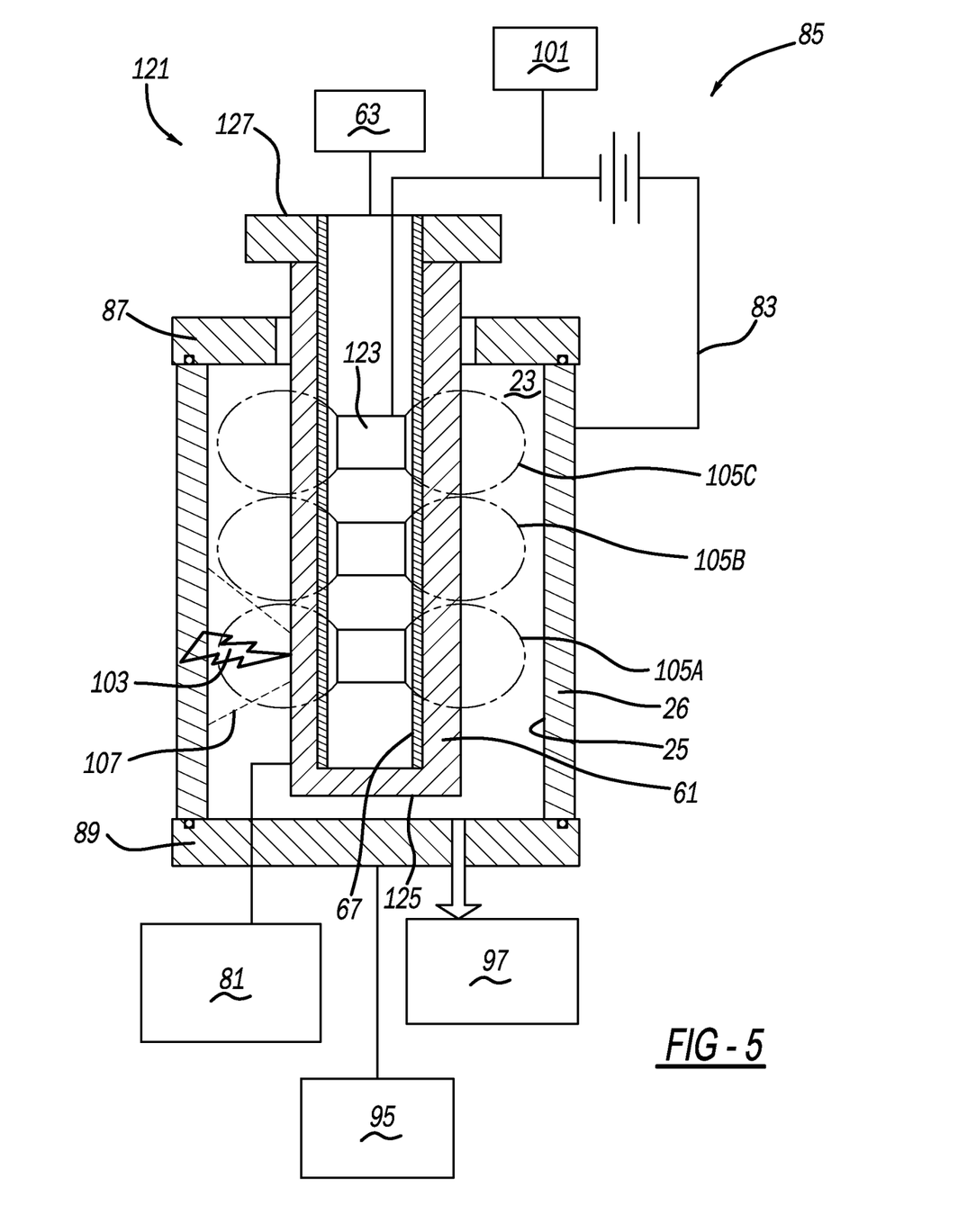
FIG. 5 is a longitudinal sectional view showing a second embodiment of the present system and method.

During operation, after the seal is created and vacuum drawn, programmable controller 101 causes ignitor 81 to generate an electrical arc 103 from anode workpiece 26 to cathode 61 within the vacuum. This causes ionization of the cathodic material at various evaporative spots on the cathode adjacent a magnetic field 105 created by magnet 69. The magnetic field will control and guide the location of these cathode spots which in turn controls and guides where the plasma ionization is generated and emitted from. Thus, the ionic ta-C coating 107 is transferred within at least a portion of the magnetic field, and in a generally expanding fan-like side view shape, from the cathode to the anode workpiece 26. Based on predetermining time and speed values, programmable controller 101 subsequently causes actuator 71 to move magnet 69 in the linearly retracting and/or advancing direction(s) within the cathode in order to linearly move the magnetic field therealong. A tunnel magnetic field shape (as shown in FIG. 5) allows the cathode spots to run around the diameter within a limited vertical range of the cylindrical cathode. The limits are set by the magnetic field. When the field moves up and down, the arc spots follow the field but continue to run around the circumference of the cathode. The ionic cathode spots will follow the magnetic field 105 during this magnet movement thereby uniformly and quickly coating inner surface 25 of workpiece anode 26 without requiring movement of the cathode itself or movement of the workpiece during the coating operation. A single or multiple coating passes may be employed.

When completed, programmable controller 101 will electrically terminate the electrical arc, de-energize the vacuum pump 97 and cause a relief valve to vent the vacuum chamber to ambient outside air pressure, energize mechanism 63 to withdraw and retract cathode 61, and energize mechanism 95 to retract end caps 87 and 89. Thereafter, the engine block is moved from the workstation and a new engine block is subsequently inserted therein for another coating cycle. It is envisioned that the entire coating process, from sealing of the bore through unsealing of the bore will be five minutes or less, and more preferably two minutes or less.

The present system and method are expected to achieve an spa bond fraction percentage for carbon atoms of about 20-85%, which is controlled by the energy of the carbon ions and substrate temperature during plasma coating. It is envisioned that the present system and method will employ an ion impact energy of about 10-250 eV, which is far superior to traditional sputter coating of less than 5 eV. Furthermore, room temperature use of the present system and method are preferred to increase the fraction percentage, although temperatures less than 400° C. may also suffice.

The cathode is expected to generate less than 120° C. at its outer surface during the coating process, if about 2 kW of electrical power for about 120 seconds is employed. In this advantageously expected cool-cathode situation, cooling of the permanent magnet may be performed through a copper cylinder externally located adjacent to the proximal end of the cathode which acts as a heat sink, thereby avoiding the use of cooling fluid. Alternately, a hollow copper fluid-carrying tube with internal cooling channels, surrounded by a carbon sleeve or the like, is optionally located within the cathode around the permanent magnet. This alternate tube and sleeve serve to cool the magnet.

In an optional feature, the present system and method may employ a prior or subsequent separate cathode made of a different conductive material, such as a metal (for example: chromium, tantalum, niobium, titanium), using the same process within the bore vacuum before the use of the graphite cathode to deposit metals or metal nitrides. Metal nitrides would be deposited reactively, that is, by adding a partial pressure of nitrogen to the process during arc evaporation of the metal. This multiple cathode process allows for initial coating of the inner bore surface 25, especially if aluminum, with the more ductile metal material prior to application of the much harder ta-C coating layer to minimize cracking of the aluminum workpiece.

Reference should now be made to FIG. 5. A second exemplary embodiment of a magnetic-field-assisted coating system 121 is essentially the same as that of the FIG. 3 embodiment, however, the magnetic source and operation are different. In this version, the magnetic source includes at least two, and more preferably three, electromagnets 123 stationarily located within the hollow interior 67 of elongated cathode 61. The electromagnets are spaced apart from each other with an air gap or insulation therebetween and are each electrically connected to electrical circuit 83 and the associated programmable controller 101. Each electromagnet includes a conductive wire wrapped around an iron core. In operation after bore 23 is sealed and vacuum pump 97 draws the vacuum in each bore, controller 101 will cause electrical current to be sequentially provided to each of the electromagnets 123 based on predetermined time and speed values. This causes a linear or longitudinal sequential energization of electromagnets 123 which energizes a first electromagnetic field 105A adjacent a distal end 125 of cathode 61 for transmission of arc 103 and plasma ta-C ions 107 thereat. Next, this first electromagnet is de-energized and a second electromagnet is energized to create a middle magnetic field 105B. Accordingly, the electric arc 103 and coating ions 107 linearly follow to this middle magnetic field location. Then, the middle electromagnet is de-energized by controller 101 and the third electromagnet, closest to the proximal cathode end 127, is energized to create a magnetic field 105C thereat. This again linearly moves arc 103 and coating ions 107 to this third magnetic field location. This construction beneficially does not require any moving parts during the coating process after sealing of the end caps.

FIG. 6 illustrates a third exemplary embodiment with a longitudinally elongated cathode 61 having multiple spaced apart electromagnets 123 as in the FIG. 5 embodiment. However, this FIG. 6 system and method are employed with an anode workpiece 151 defined as an elongated metallic tube or pipe. This is ideally suited for internally coating the interior surface 25 surrounding bore 23 with a diamond-like hard coating of ta-C. This arrangement is ideally suited in a tube 151 of at least 3 meters in longitudinal length which can be employed for transporting or carrying abrasive liquids or slurries, such as sand, or corrosive materials such as those found in sulphuric acid or carbon dioxide contaminated oil from tar-sand extraction. As an option if the tubular workpiece is long, two mirrored image cathodes may be inserted, one in each end, through their corresponding end caps.

Figure 7:
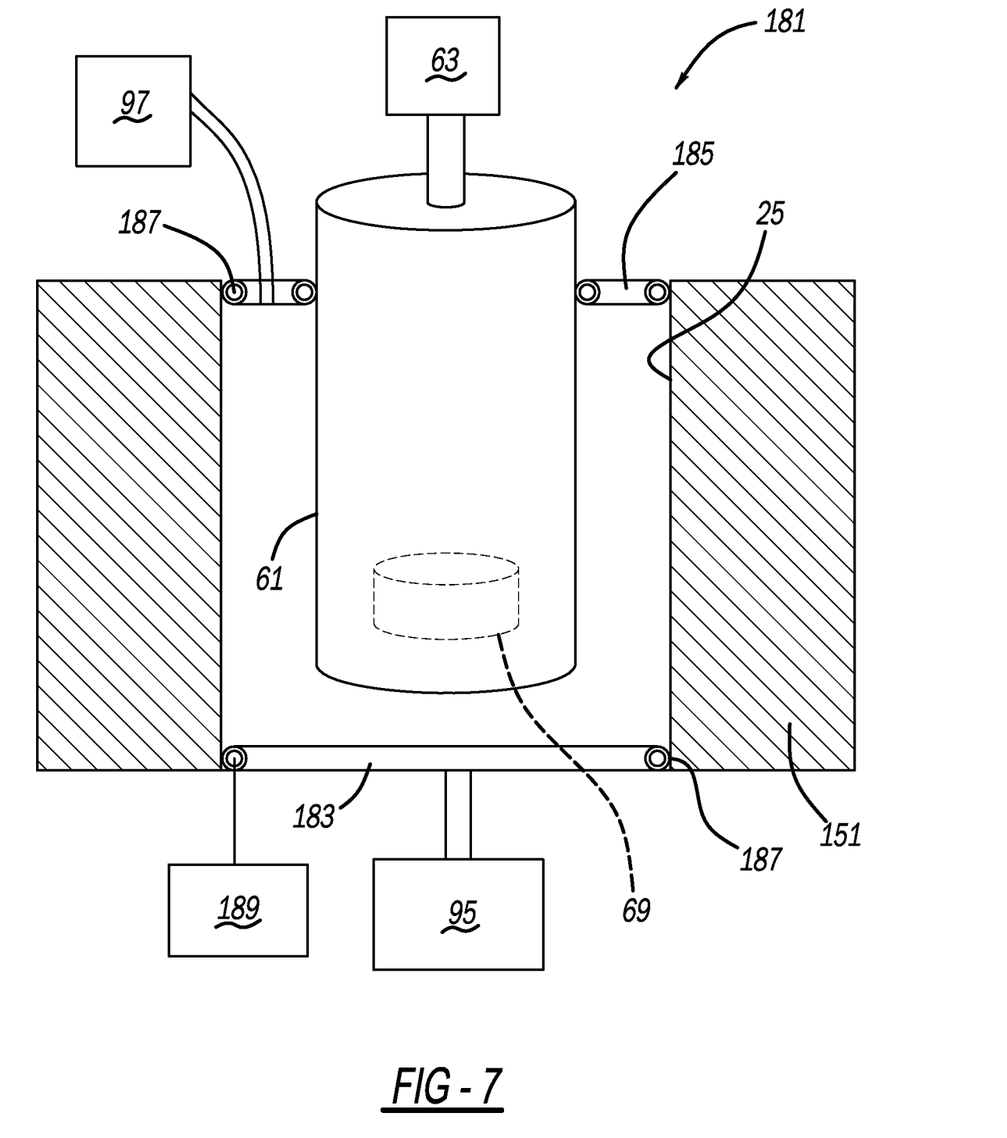
FIG. 7 is a longitudinal sectional view showing a fourth embodiment of the present system and method.

A fourth exemplary embodiment system 181 is shown in FIG. 7. This embodiment is similar to any of those previously discussed herein above, however, end caps 183 and 185 employ inflatable bulb seals 187, each having a generally circular or oval enclosed cross-sectional shape surrounding the periphery thereof. Seals 187 are deflated when end caps 183 and 185 are inserted into ends of bore 23 and then a positive air pressure pump 189 supplies air to inflate the seals to create a pressure resistant seal between the end caps and inner bore surface 25 and/or between end cap 185 and an exterior of cathode 61.

Figure 8:
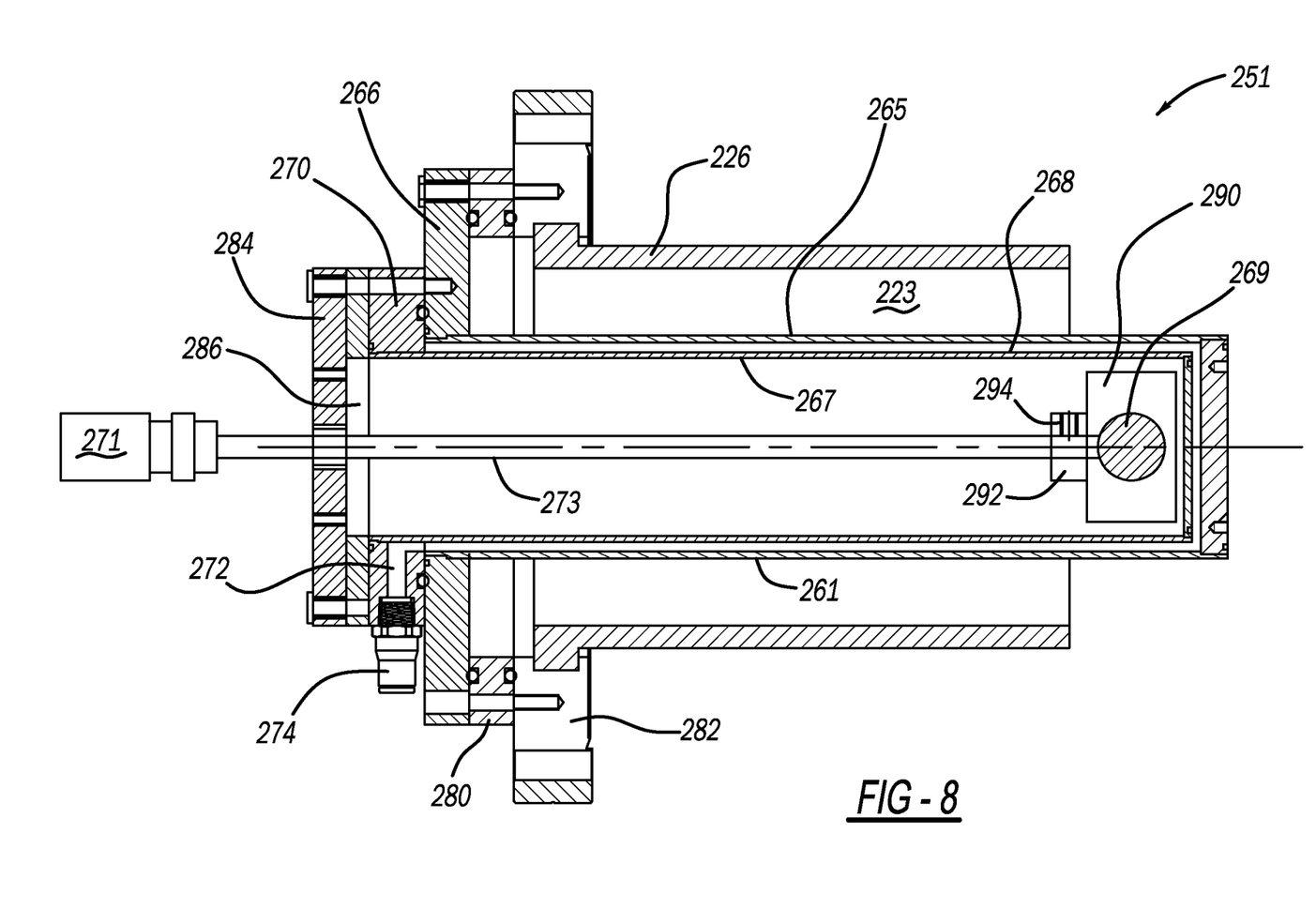
FIG. 8 is a longitudinal sectional view showing a fifth embodiment of the present system and method.

FIG. 8 depicts a fifth exemplary embodiment of a magnetic-field-assisted plasma coating system 251 which is the same as the first embodiment except as follows. System 251 employs a machine including an outer cathode 261 with a cylindrical section 265 and a flange section 266. A cylindrical ring target material can be attached to outer cathode 261. The machine of system 251 further provides an inner cathode 268 including a cylindrical section 267 and a flange section 270. Flange section 270 overlies and is secured to flange section 266, while cylindrical section 267 is concentrically located internal to cylindrical section 265 with a lateral gap therebetween. A cooling conduit 272 and ports 274 are associated with inner cathode 268 for supplying cooling fluid between cylindrical sections 267 and 265.

An insulator 280 is mounted between flange 266 and a vacuum flange 282 to which they are fastened. Moreover a motor support plate 284 is fastened to flange 270 with an insulator 286 therebetween. An actuator 271, such as an electric motor, and a longitudinally elongated and solid transmission shaft 273 are moveably coupled to support plate 284. Shaft 273 is operably driven by actuator 271.

A magnet holder 290 is retained to a distal end of shaft 273 via a connector 292 having a set screw 294 or other fastener. A permanent magnet 269 of a cylindrical shape (as illustrated in cross-section), ring (not shown), or rectangular-cubic shape (not shown) is secured within holder 290 for longitudinal and/or rotational movement by shaft 273 and motor 271. Magnet holder 290 is electrically isolated from cathode 268. Cathodes 268 and 261, and magnet 269 within the cathodes, are longitudinally insertable into and removeable from an open access end of an internal bore 223 of an engine or pipe workpiece 226. Any of the previously discussed end caps and/or seals may be employed to create a vacuum chamber within the internal bore area using workpiece 226 to define part of the vacuum chamber while the workpiece also acts as an anode. An exterior of the workpiece may be exposed to ambient air since a separate vacuum chamber is not necessary.

While various embodiments of the present system and method have been discussed, additional variations may be employed. For example, automated actuators, mechanisms and controllers have been disclosed for moving and activating the preferred machine, but manual movement and control may alternately be employed although various advantages may not be achieved. Furthermore, each of the features may be interchanged and intermixed between any and all of the embodiments. Changes and modifications are not to be regarded as a departure from the spirit or the scope of the present invention.

The invention claimed is:

1. A method for coating a workpiece, the method comprising:
    (a) inserting an elongated cathode inside an elongated internal bore of the workpiece;
    (b) sealing at least one open end of the bore, such that the workpiece itself defines a portion of a vacuum chamber;
    (c) creating a vacuum in the vacuum chamber between the workpiece and the cathode;
    (d) emitting a process gas into the vacuum chamber;
    (e) generating an arc in a plasma between the cathode and the workpiece, the workpiece acting as an anode;
    (f) ionizing the gas in the vacuum chamber while depositing an ionic ta-C plasma arc deposition coating on the internal bore of the workpiece within a magnetic field;
    (g) longitudinally spacing apart at least two electromagnets and locating the electromagnets within a hollow interior of the cathode;
    (h) a programmable controller and an electrical circuit being connected to the electromagnets;
    (i) moving the magnetic field within the vacuum chamber to assist in linearly and rotationally moving the arc relative to the workpiece, the arc spanning between the cathode and the internal bore of the workpiece;
    (j) sequentially energizing and de-energizing the at least two electromagnets to sequentially energize and de-energize the electromagnetic field in corresponding locations;
    (k) causing the arc and coating ions to linearly follow the magnetic field locations without movement of the cathode, the electromagnets or the workpiece during the depositing;
    (l) a complete coating cycle from when vacuum pressure is started to when vacuum pressure ends, is no greater than five minutes; and
    (m) exposing an exterior of the workpiece to ambient air during the coating cycle.

2. The method of claim 1, further comprising:
    causing the workpiece to be stationary when the magnetic field passes between the cathode and the workpiece; and only placing a single and stationary cathode within the internal bore of the workpiece when the magnetic field passes between the cathode and the workpiece.

3. The method of claim 1, further comprising:
    removably locating an end cap over the internal bore, the end cap defining part of the vacuum chamber, and the vacuum chamber being entirely within the internal bore inside the workpiece; and
    sealing the end cap to an open edge of the workpiece within which is the internal bore, the edge being of substantially a same thickness as a wall of the workpiece which surrounds at least a majority of the cathode.

4. The method of claim 1, further comprising:
    retaining a magnet holder to a distal end of a shaft;
    electrically isolating the magnet holder from the cathode; and
    longitudinally and rotationally moving the magnet holder with an automated actuator controlled by the programmable controller.

5. The method of claim 1, further comprising:
    causing a magnetic force at an outer surface of the cathode to be 1-20 milliteslas.

6. The method of claim 1, wherein:
    the outer surface of the elongated cathode includes graphite.

7. The method of claim 1, further comprising the programmable controller controlling the arc, a vacuum pump, a relief valve, a seal-actuator and a cathode-movement actuator.

8. The method of claim 1, wherein coating the internal bore of the workpiece includes depositing the coating on an internal piston cylinder of a metallic automotive vehicle engine block, and the cathode is a cool-cathode of less than 120° C. at an outer surface thereof to avoid the use of cooling fluid during the coating.

9. The method of claim 1, wherein the workpiece is a metallic tube or pipe which is at least three meters long and configured for transporting corrosive or abrasive liquids or slurries.

10. The method of claim 1, further comprising inflating a bulb seal to seal an endcap to the workpiece, a centerline of the cathode intersecting the endcap, and the endcap enclosing an adjacent end of the internal bore.

11. A method for coating a workpiece, the method comprising:
    (a) locating a cathode inside an internal bore of the workpiece;
    (b) covering an open end of the bore by removably contacting the workpiece with an endcap, such that a vacuum chamber is defined at least in part by the bore and the endcap;
    (c) creating a vacuum in the vacuum chamber while exposing an exterior of the workpiece to ambient air;
    (d) generating an arc in a plasma between the cathode and the workpiece;
    (e) causing the workpiece to be an anode;
    (f) depositing an ionic coating on a cylindrical surface defining the internal bore by plasma arc deposition coating;
    (g) moving a magnetic field within the bore to cause the arc to move relative to the workpiece, the arc spanning between the cathode and the internal bore of the workpiece;
    (h) longitudinally spacing apart at least two electromagnets and locating the electromagnets within a hollow interior of the cathode;

(i) connecting a programmable controller and an electrical circuit to the electromagnets;

(j) sequentially energizing and de-energizing the at least two electromagnets to sequentially energize and de-energize the electromagnetic fields in corresponding locations; and (k) causing the arc and coating ions to linearly follow the magnetic field locations without movement of the cathode, the electromagnets or the workpiece during the depositing.

12. The method of claim 11, further comprising:
causing the workpiece to be stationary when the magnetic field passes between the cathode and the workpiece;
the depositing causing the coating to have an ion impact energy of at least 10 eV against the workpiece;
locating an exterior surface of the cathode 2-5 cm away from an inner surface of the bore; and
the depositing of the ionic coating including depositing an ionic ta-C coating on the bore surface in an outwardly extending fan-like side view shape.

13. The method of claim 11, further comprising sealing the end cap to an open edge of the workpiece within which is the internal bore, the edge being of substantially a same thickness as a wall of the workpiece which surrounds at least a majority of the cathode, and a longitudinal length of the cathode is greater than a lateral diameter of the cathode.

14. The method of claim 11, further comprising:
retaining a magnet holder to an elongated shaft;
electrically isolating the magnet holder from the cathode.

15. The method of claim 11, further comprising:
locating more than two of the electromagnets within a hollow interior of the cathode, all of the electromagnets being longitudinally arranged relative to each other; and
causing a magnetic force at an outer surface of the cathode to be 1-20 milliteslas.

16. The method of claim 11, further comprising the programmable controller controlling the arc, a vacuum pump, a relief valve, a seal-actuator and a cathode-movement actuator.

17. The method of claim 11, wherein the workpiece is an internal piston cylinder, and the cathode is less than 120° C. at an outer surface thereof without the use of cooling fluid during the depositing.

18. The method of claim 11, wherein the workpiece is a metallic tube or pipe which is at least three meters long and configured for transporting corrosive or abrasive liquids or slurries.

19. The method of claim 11, further comprising inflating a bulb seal to seal the endcap to the workpiece, subsequently creating the vacuum within the sealed bore, and thereafter performing the depositing in the sealed bore.

20. A method for coating a workpiece, the method comprising:
(a) inserting a cathode inside an internal bore of the workpiece;
(b) sealing at least one open end of the bore;
(c) generating an arc in a plasma between the cathode and the workpiece, which acts as an anode;
(d) using a magnetic field adjacent the cathode to assist in controlling the arc;
(e) plasma arc deposition coating an internal and metallic workpiece surface surrounding the bore with an ion impact energy of at least 10 eV;

(f) the coating cycle being no greater than five minutes from when a vacuum pressure is started to when the vacuum pressure ends;
(g) the internal workpiece surface being coated with a harder material than the remainder of the workpiece adjacent the bore;
(h) longitudinally spacing apart at least two electromagnets and locating the electromagnets within a hollow interior of the cathode;
(i) sequentially energizing and de-energizing the at least two electromagnets to sequentially energize and de-energize electromagnetic fields in corresponding locations; and
(j) causing the arc and coating ions to linearly follow the magnetic field locations without movement of the cathode, the electromagnets or the workpiece during the depositing.

21. The method of claim 20, further comprising reducing pressure within the bore for the coating process.

22. The method of claim 20, further comprising:
causing the workpiece to be stationary when the magnetic field passes between the cathode and the workpiece;
locating an exterior surface of the cathode 2-5 cm away from an inner surface of the bore; and
the deposition coating depositing an ionic ta-C material layer on the bore surface in an outwardly extending and expanding side view shape.

23. The method of claim 20, further comprising sealing a removable end cap to an open edge of the workpiece within which is the internal bore, the edge being of substantially a same thickness as a wall of the workpiece which surrounds at least a majority of the cathode, and a longitudinal length of the cathode being greater than a lateral diameter of the cathode.

24. The method of claim 20, further comprising:
retaining a magnet holder to an elongated shaft;
securing the electromagnets to the holder; and
electrically isolating the magnet holder from the cathode.

25. The method of claim 20, further comprising:
locating the electromagnets within the hollow interior of the cathode; and
causing a magnetic force at an outer surface of the cathode to be 1-20 milliteslas.

26. The method of claim 20, further comprising:
longitudinally spacing apart more than two of the electromagnets and locating all of the electromagnets within the hollow interior of the cathode; and
connecting a programmable controller and an electrical circuit to the electromagnets.

27. The method of claim 20, further comprising a programmable controller controlling the arc, a vacuum pump, a relief valve, a seal-actuator and a cathode-movement actuator.

28. The method of claim 20, wherein the workpiece is an internal piston cylinder, and the cathode is less than 120° C. at an outer surface thereof without the use of cooling fluid during the coating.

29. The method of claim 20, wherein the workpiece is a metallic tube or pipe which is at least three meters long and configured for transporting corrosive or abrasive liquids or slurries.

30. The method of claim 20, further comprising inflating a bulb seal to seal an endcap to the workpiece, subsequently creating the vacuum within the sealed bore, and thereafter performing the coating in the sealed bore.

* * * * *